(12) United States Patent
Barnes

(10) Patent No.: US 6,622,273 B1
(45) Date of Patent: Sep. 16, 2003

(54) SCAN LATCH CIRCUIT

(75) Inventor: William Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/546,752

(22) Filed: Apr. 11, 2000

(30) Foreign Application Priority Data

Aug. 24, 1999 (GB) ................................................ 9920077

(51) Int. Cl.[7] ..................... G01R 31/28; G01R 31/3187
(52) U.S. Cl. ........................................ 714/733; 714/726
(58) Field of Search ................................. 714/724–734

(56) References Cited

U.S. PATENT DOCUMENTS

| | | | |
|---|---|---|---|
| 4,740,970 A | | 4/1988 | Burrows et al. ............... 371/15 |
| 5,457,698 A | * | 10/1995 | Segawa et al. ............. 714/731 |
| 5,592,493 A | * | 1/1997 | Crouch et al. ............. 324/73.1 |
| 5,825,785 A | * | 10/1998 | Barry et al. ................. 714/732 |
| 6,158,032 A | * | 12/2000 | Currier et al. .............. 714/726 |
| 6,185,710 B1 | * | 2/2001 | Barnhart ...................... 714/727 |
| 6,195,775 B1 | * | 2/2001 | Douskey et al. ............ 714/727 |
| 6,393,592 B1 | * | 5/2002 | Peeters et al. .............. 714/727 |

FOREIGN PATENT DOCUMENTS

EP 0 822 497 2/1998 ......... G06F/11/267

OTHER PUBLICATIONS

European Standard Search Report from GB 9920077, filed Aug. 24, 1999.

* cited by examiner

Primary Examiner—Albert Decady
Assistant Examiner—Cynthia Britt
(74) Attorney, Agent, or Firm—Wolf, Greenfield & Sacks, P.C.; James H. Morris; Robert A. Skrivanek, Jr.

(57) ABSTRACT

A circuit is described which allows a scan latch to selectively pass inputs derived from either of two test outputs, e.g. scan test and built-in self-test data, but which does not apply an added delay to a data path when this is instead selected.

19 Claims, 1 Drawing Sheet

SCAN LATCH CIRCUIT

FIELD OF THE INVENTION

The present invention relates to a scan latch circuit useable where alternative testing methods are employed on an associated circuit, and to the combination of such a scan latch circuit with an associated circuit.

BACKGROUND OF THE INVENTION

Scan latches are known components of test circuitry for circuits, and especially complex circuits such as memories. Such scan lathes typically have a two-input multiplexer with a control input for selecting between those two inputs from the output of the multiplexer feeding to latch circuitry. The control input receives a two state signal called scan enable, so that when it is a logical 1 state the second input, the scan input is applied from the multiplexer output to the latch circuitry. When the scan enable input is at logical 0, the first input, the data input is provided by the multiplexer to the latch circuitry.

Where such scan latches are used with a built-in self-test (BIST) arrangement—so that both scan test and built-in self-test (BIST) can be used—it is conventional to connect an input multiplexer to the first input of the scan latch, the input multiplexer having a first input for data output from the memory, a second input for the built-in self-test data from the memory and a control input for selecting between the two inputs.

Such a scan latch circuit is disadvantageous in that an additional gate delay is built in to the memory data path.

It is accordingly an object of the present invention to overcome difficulties of the prior art.

SUMMARY OF THE INVENTION

According to a first aspect of the present invention there is provided a scan latch circuit for a circuit having a data output and first and second outputs for test information, the scan latch circuit comprising a scan latch having first and second inputs and a control input for selecting between said first and second inputs for input to latch circuitry of said scan latch, the circuit further having first and second select signal inputs for selecting first and second test modes in which a respective one of said first and second test information is passed to said latch circuitry, wherein said data output is connected directly to one of said first and second inputs of said scan latch, and wherein said first and second outputs and said first and second select signals are connected by further circuitry to said control and said other input of said scan latch.

Preferably said further circuitry comprises a two input multiplexer having one input connected to receive said first output, the other input of said two input multiplexer being connected to receive said second output, the select terminal of said multiplexer being connected to receive one of said first and second select signals.

Advantageously said first and second select signals are connected to the control input of said scan latch via an OR gate whereby said control input responds to the logical OR of said select signals.

According to a second aspect of the invention there is provided the combination of a scan latch circuit and a circuit having a data output and first and second outputs for test information, the scan latch circuit comprising a scan latch having first and second inputs and a control input for selecting between said first and second inputs for input to latch circuitry of said scan latch, the scan latch circuit further having first and second select signal inputs for selecting first and second test modes in which a respective one of said first and second test information is passed to said latch circuitry, wherein said data output is connected directly to one of said first and second inputs of said scan latch, and wherein said first and second outputs and said first and second select signals are connected by further circuitry to said control and said other input of said scan latch.

According to a third aspect of the invention there is provided the combination of a scan latch circuit and a memory having a data output and first and second outputs for test information, the scan latch circuit comprising a scan latch having first and second inputs and a control input for selecting between said first and second inputs for input to latch circuitry of said scan latch, the scan latch circuit further having first and second select signal inputs for selecting first and second test modes in which a respective one of said first and second test information is passed to said latch circuitry, wherein said data output is connected directly to one of said first and second inputs of said scan latch, and wherein said first and second outputs and said first and second select signals are connected by further circuitry to said control and said other input of said scan latch.

Preferably said further circuitry comprises a two input multiplexer having one input connected to receive said first output, the other input of said two input multiplexer being connected to receive said second output, the select terminal of said multiplexer being connected to receive one of said first and second select signals.

Advantageously said first and second select signals are connected to the control input of said scan latch via an OR gate whereby said control input responds to the logical OR of said select signals.

Conveniently said circuit comprise a memory.

BRIEF DESCRIPTION OF THE DRAWINGS

An embodiment of the present invention will now be described, by way of example only, with reference to the accompanying drawings in which.

DESCRIPTION OF THE PREFERRED EMBODIMENTS

Figure 1:
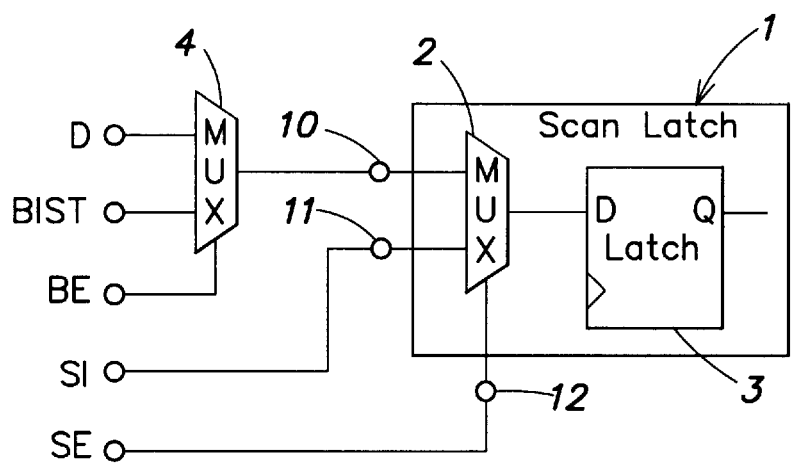
FIG. 1 shows a schematic diagram of a conventional test circuit using a scan latch.

In the various figures like reference numerals refer to like parts.

Referring to FIG. 1 the scan latch 1 consists of a two input multiplexer 2 having a first input 10 and a second input 11 and further having a control input 12. The multiplexer output is connected to the input of latch circuitry 3, here shown figuratively as a single flip flop.

An input multiplexer 4 has an output terminal connected to the first input 10 of the scan latch and further has two inputs D and BIST as well as a control input BE. The second input 11 of the scan latch is provided at an input terminal (SI) and the control input at an input terminal (SE).

The circuitry of FIG. 1 is connected to memory circuitry and has three modes of operation, a normal mode in which the memory is addressed in a conventional way to provide a data output connected to terminal D, a scan mode in which data are scanned through the memory and the output provided at the terminal (SI) and a third built-in self-test mode in which the configuration of the memory is set, together with external circuitry to cause the memory to cycle through all the possible states of the memory.

The operation of the scan latch circuitry of FIG. 1 will now be described:

In the normal mode, the input terminal (BE) (BIST enable) is set to zero and the input to terminal (SE) (scan enable) is likewise set at zero.

In this state the input multiplexer 4 connects the D input (memory data) to the first input terminal 10 of the scan latch and the multiplexer 2 of the scan latch connects the first input 10 to the latch circuitry 3.

In the built-in self-test mode, signal (BE) is set to logical 1, whereas signal (SE) is set to logical 0. Thus, the built-in self-test input (BIST) is connected by the input multiplexer 4 to the first input terminal 10 of the scan latch, the multiplexer 2 continuing to supply the first input 10 to the latch circuitry 3.

Finally, in the scan mode, the scan enable signal (SE) is set to logical 1 and the second input 11 which receives the scan input from the memory is connected by the multiplexer 2 to the latch circuitry 3.

It will be appreciated that with the scan enable signal at logical 1, it does not matter whether the signal (BE) is at logical 1 or logical 0.

As has previously been discussed, the circuitry shown in FIG. 1 is disadvantageous in that the data input D from the memory suffers undesirable delay.

Figure 2:
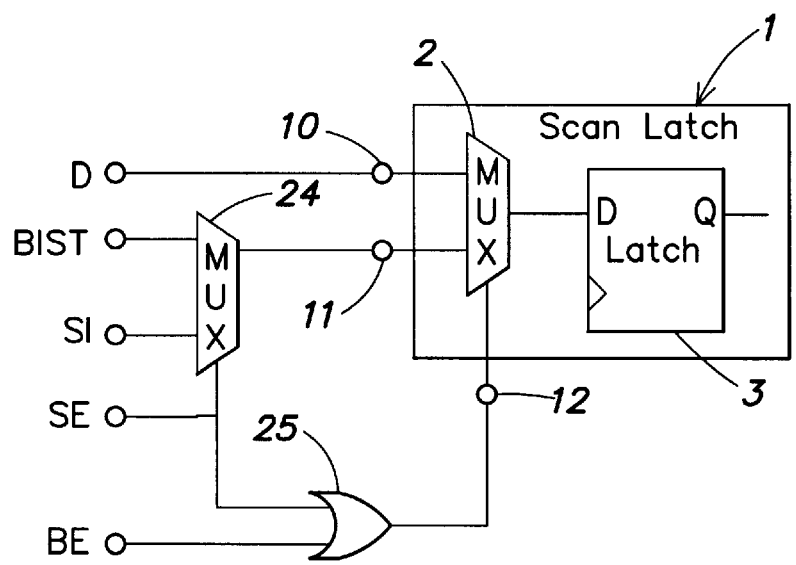
FIG. 2 shows an embodiment of scan latch circuitry in accordance with the present invention.

Turning now to FIG. 2, the scan latch circuitry of the present invention connects the data input terminal D directly to the first input terminal 10 of the scan latch 1.

The second input terminal 11 of the scan latch 1 is derived from the output of a two-input multiplexer 24, the two inputs to the multiplexer being derived from the built-in self-test (BIST) and the scan input data signal (SI). The two-input multiplexer 24 is controlled by the scan enable signal (SE).

The control input 12 of the scan latch is provided by the output of the two input OR gate 25 whose inputs are provided by the BIST enable signal (BE) and the scan enable signal (SE).

In operation, when both the scan enable signal and the BIST enable signal (SE,BE) are at logical 0, control input 12 of the scan latch 1 is at logical 0 and the data input D of the memory is connected via the multiplexer 2 of the scan latch to the latch circuitry 3 of the scan latch.

If either or both signals SE and BE are at logical 1, a logical 1 output is provided by the OR gate 25 to the control input 12 of the scan latch so that the scan latch multiplexer 2 connects the second input 11 of the scan latch to the latch circuitry 3. If the scan enable input (SE) is at logical 1, then the input multiplexer 24 connects the second input (SI) to the second input 11 of the scan latch and thus to the latch circuitry 3. Only if the BIST enable signal (BE) is at logical 1 and the scan enable signal (SE) as at logic 0 is the BIST data signal BIST connected by the input multiplexer 24 to the second input 11 of the scan latch, and thus to the latch circuitry 3 of the scan latch.

It will be seen that this arrangement is advantageous in that the data input to the scan latch, which is critical path for normal operation, is not impeded by passage through a multiplexer or by gating circuitry. The arrangement is disadvantageous in that an additional gate 25 is required by comparison with the conventional circuit but it will be understood by those skilled in the art that for a conventional memory arrangement there will be a scan latch for each bit (e.g. 32 bits) of the memory and that the gate 25 is shared between all of the scan latches.

The invention has been described in the context of a memory having scan test and built-in self-test arrangements. It is however to be understood that the invention is applicable to any circuitry in an application which permits any alternative testing methodologies to be used.

What is claimed is:

1. A scan latch circuit for a circuit having a data output, a first output for first test information and a second output for second test information, the scan latch circuit comprising:
   a scan latch having latch circuitry, first and second inputs, and a control input for selecting between said first and second inputs for input to said latch circuitry; and
   first and second select signal inputs for selecting first and second test modes in which a respective one of said first and second test information is provided to said latch circuitry;
   wherein said data output is connected directly to one of said first and second inputs of said scan latch, and wherein said first and second outputs and said first and second select signal inputs are connected by further circuitry to said control input and said other input of said scan latch.

2. A scan latch circuit as claimed in claim 1 wherein said further circuitry comprises a two input multiplexer having one input connected to receive said first output, the other input of said two input multiplexer being connected to receive said second output, a select terminal of said multiplexer being connected to receive one of said first and second select signal inputs.

3. A scan latch circuit as claimed in claim 2 wherein said first and second select signal inputs are connected to the control input of said scan latch via an OR gate whereby said control input responds to the logical OR of said select signal inputs.

4. The combination of a scan latch circuit and a circuit having a data output, a first output for first test information, and a second output for second test information, the scan latch circuit comprising:
   a scan latch having latch circuitry, first and second inputs, and a control input for selecting between said first and second inputs for input to said latch circuitry; and
   first and second select signal inputs for selecting first and second test modes in which a respective one of said first and second test information is provided to said latch circuitry;
   wherein said data output is connected directly to one of said first and second inputs of said scan latch, and wherein said first and second outputs and said first and second select signal inputs are connected by further circuitry to said control input and said other input of said scan latch.

5. The combination recited in claim 4, wherein said further circuitry comprises a two input multiplexer having one input connected to receive said first output, the other input of said two input multiplexer being connected to receive said second output, a select terminal of said multiplexer being connected to receive one of said first and second select signal inputs.

6. The combination recited in claim 5 wherein said first and second select signal inputs are connected to the control input of said scan latch via an OR gate whereby said control input responds to the logical OR of said select signal inputs.

7. The combination recited in claim 4 wherein said first and second test modes are respectively scan and built-in self-test modes, and said first and second signal inputs are respectively scan and built-in self-test enable signal inputs.

8. The combination of a scan latch circuit and a memory having a data output, a first output for first test information, and a second output for second test information, the scan latch circuit comprising:

a scan latch having latch circuitry, first and second inputs, and a control input for selecting between said first and second inputs for input to said latch circuitry; and first and second select signal inputs for selecting first and second test modes in which a respective one of said first and second test information is provided to said latch circuitry;

wherein said data output is connected directly to one of said first and second inputs of said scan latch, and wherein said first and second outputs and said first and second select signal inputs are connected by further circuitry to said control input and said other input of said scan latch.

9. The combination recited in claim 8 wherein said further circuitry comprises a two input multiplexer having one input connected to receive said first output, the other input of said two input multiplexer being connected to receive said second output, a select terminal of said multiplexer being connected to receive one of said first and second select signal inputs.

10. The combination recited in claim 9 wherein said first and second select signal inputs are connected to the control input of said scan latch via an OR gate whereby said control input responds to the logical OR of said select signal inputs.

11. The combination recited in claim 10 wherein said first and second test modes are respectively scan and built-in self-test modes, and said first and second signal inputs are respectively scan and built-in self-test enable signal inputs.

12. A system comprising a scan latch circuit and an associated circuit, the system being operable in at least three modes, each mode being selected depending on select signal inputs, the associated circuit having a data output and first and second outputs for test information, the scan latch circuit comprising:

a scan latch for receiving first and second inputs and a control input, the scan latch having latch circuitry and selection circuitry for selecting between applying the first input and the second input to the latch circuitry, the selection being based on the control input; and further circuitry for receiving the first and second outputs and the select signal inputs and for providing a controlling signal to the control input based on the select signal inputs;

wherein the data output is connected directly to one of the first and second inputs of the scan latch.

13. The system according to claim 12, wherein during a normal mode data is transferred directly between the scan latch circuit and the associated circuit, whereas for the other modes test information is transferred through the further circuitry between the scan latch circuit and the associated circuit by connecting the first and second outputs and the select signal inputs to the control and the other input of the scan latch.

14. The system according to claim 13, wherein the other modes comprise a scan in mode and a built-in self-test mode.

15. The system according to claim 12, wherein the select signal inputs comprise a scan test select signal input and a built-in self-test select signal input.

16. A scan latch circuit comprising:

a scan latch having a first input, a second input, and a control input, the scan latch including latch circuitry and providing one of the first input and the second input to the latch circuitry dependent upon a state of the control input;

a data input directly connected to the first input of the scan latch to receive data;

a first test input to receive first test information;

a second test input to receive second test information;

a first select input to receive a first select signal; and a second select input to receive a second select signal;

wherein one of the data, the first test information, and the second test information is provided to the latch circuitry based upon the first and second select signals.

17. The scan latch circuit according to claim 16, further comprising:

a multiplexer having a first input, a second input, a control input, and an output; and an OR gate having first and second inputs and an output;

wherein the first test input is connected to the first input of the multiplexer, the second test input is connected to the second input of the multiplexer, the output of the multiplexer is connected to the second input of the scan latch, the first select input is connected to the control input of the multiplexer and the first input of the OR gate, the second select input is connected to the second input of the OR gate, and the output of the OR gate is connected to the control input of the scan latch.

18. The scan latch circuit according to claim 17, wherein the first test information is scan data.

19. The scan latch circuit according to claim 18, wherein the second test information is built-in self-test data.

* * * * *